(12) United States Patent
Juvekar et al.

(10) Patent No.: US 12,362,556 B2
(45) Date of Patent: Jul. 15, 2025

(54) SINGLE-ENDED BROKEN CONDUCTOR DETECTION LOGIC USING INCREMENTAL QUANTITIES

(71) Applicant: Schweitzer Engineering Laboratories, Inc., Pullman, WA (US)

(72) Inventors: Gandhali P Juvekar, Pullman, WA (US); Yanfeng Gong, Dublin, OH (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 219 days.

(21) Appl. No.: 18/179,499

(22) Filed: Mar. 7, 2023

(65) Prior Publication Data
US 2024/0305089 A1    Sep. 12, 2024

(51) Int. Cl.
*H02H 7/22* (2006.01)
*G01R 31/08* (2020.01)

(52) U.S. Cl.
CPC ......... *H02H 7/226* (2013.01); *G01R 31/086* (2013.01); *G01R 31/088* (2013.01); *H02H 7/22* (2013.01)

(58) Field of Classification Search
CPC ............ H02H 3/02; H02H 7/26; H02H 7/226; H02H 1/0007; H02H 5/10; G01R 31/02; G01R 31/08
USPC ..................................................... 361/62–69
See application file for complete search history.

(56) References Cited

U.S. PATENT DOCUMENTS

| | | |
|---|---|---|
| 4,161,011 A | 7/1979 | Wilkinson |
| 4,297,740 A | 10/1981 | Hagberg |
| 4,347,542 A | 8/1982 | Calhoun |
| 4,357,644 A | 11/1982 | Schmidt |
| 4,405,966 A | 8/1983 | Cavero |
| 4,600,961 A | 7/1986 | Bishop |
| 4,825,327 A | 4/1989 | Alexander |
| 5,140,492 A | 8/1992 | Schweitzer |
| 5,703,745 A | 12/1997 | Roberts |
| 5,883,578 A | 3/1999 | Roberts |
| 6,028,754 A | 2/2000 | Guzman-Casillas |
| 6,453,248 B1 | 9/2002 | Hart |
| 6,573,726 B1 | 6/2003 | Roberts |

(Continued)

FOREIGN PATENT DOCUMENTS

| | | |
|---|---|---|
| CN | 1601848 | 3/2005 |
| CN | 101699301 | 4/2010 |

(Continued)

OTHER PUBLICATIONS

Benmouyal, Gabriel; Fischer, Normann; Smyth, Bryan: "Performance Comparison Between Mho Elements and Incremental Quantity-Based Diatance Elements" Jan. 30, 2017.

(Continued)

*Primary Examiner* — Danny Nguyen
(74) *Attorney, Agent, or Firm* — Fletcher Yoder, P.C.

(57) ABSTRACT

A method and a system are used to monitor electrical measurements of a power system during a period of time. The system calculates and analyzes incremental quantities based on the electrical measurements of the power system. The incremental quantities are used to identify a conductor breaking fault in the power system. Instructions are sent out to activate certain actions (e.g., protective actions) based on the identified fault and the type of fault. The system operates continuously to provide real-time monitoring and fault identification.

20 Claims, 11 Drawing Sheets

(56) References Cited

U.S. PATENT DOCUMENTS

| | | |
|---|---|---|
| 6,721,671 B2 | 4/2004 | Roberts |
| 6,833,711 B1 | 12/2004 | Hou |
| 7,660,088 B2 | 2/2010 | Mooney |
| 7,720,619 B2 | 5/2010 | Hou |
| 7,945,400 B2 | 5/2011 | Hou |
| 8,289,668 B2 | 10/2012 | Kasztenny |
| 8,321,162 B2 | 11/2012 | Labuschagne |
| 8,410,785 B2 | 4/2013 | Calero |
| 8,525,522 B2 | 9/2013 | Gong |
| 8,558,551 B2 | 10/2013 | Mynam |
| 8,581,723 B2 | 11/2013 | Schweitzer |
| 8,736,297 B2 | 5/2014 | Yelgin |
| 8,942,954 B2 | 1/2015 | Gong |
| 9,160,158 B2 | 10/2015 | Schweitzer |
| 9,257,827 B2 | 2/2016 | Calero |
| 9,413,156 B2 | 8/2016 | O'Brien |
| 9,509,399 B2 | 11/2016 | Kasztenny |
| 9,568,516 B2 | 2/2017 | Gubba Ravikumar |
| 10,162,015 B2 | 12/2018 | Xu |
| 10,197,614 B2 | 2/2019 | Benmouyal |
| 10,261,567 B2 | 4/2019 | Mynam |
| 10,340,684 B2 | 7/2019 | Sridharan |
| 10,436,831 B2 | 10/2019 | Kang |
| 10,649,020 B2 | 5/2020 | Achanta |
| 10,823,777 B2 | 11/2020 | Dase |
| 11,143,715 B2 | 10/2021 | Bell |
| 11,169,195 B2 | 11/2021 | Naidu |
| 11,346,878 B2 | 5/2022 | Benmouyal |
| 11,598,800 B2 | 3/2023 | Kasztenny |
| 2005/0057212 A1 | 3/2005 | Harbaugh |
| 2005/0231871 A1 | 10/2005 | Karimi |
| 2007/0055889 A1 | 3/2007 | Henneberry |
| 2008/0031520 A1 | 2/2008 | Hou |
| 2008/0211511 A1 | 9/2008 | Choi |
| 2009/0150099 A1 | 6/2009 | Balcerek |
| 2011/0075304 A1 | 3/2011 | Hamer |
| 2011/0264389 A1 | 10/2011 | Mynam |
| 2012/0004867 A1 | 1/2012 | Mousavi |
| 2012/0063040 A1 | 3/2012 | Rostron |
| 2012/0068717 A1 | 3/2012 | Gong |
| 2012/0161684 A1 | 6/2012 | Tiwari |
| 2012/0330582 A1 | 12/2012 | Wiszniewski |
| 2013/0107405 A1 | 5/2013 | Blumschein |
| 2013/0221976 A1 | 8/2013 | Blumschein |
| 2014/0028116 A1 | 1/2014 | O'Brien |
| 2014/0236502 A1 | 8/2014 | Calero |
| 2014/0351472 A1 | 11/2014 | Jebson |
| 2015/0124358 A1 | 5/2015 | Hulse |
| 2016/0041216 A1 | 2/2016 | Tang |
| 2016/0091537 A1 | 3/2016 | Gaarder |
| 2016/0266193 A1 | 9/2016 | Ennis |
| 2016/0299187 A1 | 10/2016 | Liang |
| 2016/0308349 A1 | 10/2016 | Sridharan |
| 2017/0003335 A1 | 1/2017 | Kang |
| 2017/0227611 A1 | 8/2017 | Xu |
| 2017/0315168 A1 | 11/2017 | Benmouyal |
| 2018/0136269 A1 | 5/2018 | Schweitzer |
| 2018/0284180 A1 | 10/2018 | Ha |
| 2019/0317143 A1 | 10/2019 | Dase |
| 2022/0299557 A1* | 9/2022 | Yin ................. G01R 27/16 |
| 2022/0308103 A1 | 9/2022 | Kasztenny |

FOREIGN PATENT DOCUMENTS

| | | |
|---|---|---|
| CN | 102608491 | 7/2012 |
| CN | 102694375 | 9/2012 |
| CN | 102696161 | 9/2012 |
| CN | 103308823 | 9/2013 |
| CN | 104730410 | 6/2015 |
| CN | 204462305 | 7/2015 |
| CN | 105738751 | 7/2016 |
| CN | 106908692 | 6/2017 |
| CN | 105207176 | 7/2017 |
| CN | 109324269 | 2/2019 |
| CN | 109975661 | 7/2019 |
| WO | 2007086944 | 8/2007 |
| WO | 2014018909 | 1/2014 |
| WO | 2019229638 | 12/2019 |

OTHER PUBLICATIONS

Kasztenny, Bogdan: "Distance Elements for Line Protection Applications Near Unconventional Sources" Schweitzer Engineering Laboratories, Inc. Jun. 2021.

Kasztenny, Bogdan: "Short-Circuit Protection in Networks with Unconventional Power Sources" PAC World Magazine, Mar. 2021.

William O'brien, et al. "Catching Falling Conductors in Midair—Detecting and Tripping Broken Distribution Circuit Conductors at Protection Speeds" Presented at the 42nd Annual Western Protective Relay Conference, Oct. 2015.

Kanchanrao Dase and Normann Fischer, "Computationally Efficient Methods for Improved Double-Ended Transmission Line Fault Locating" Originally Presented at the 45th Annual Western Protective Relay Conference, Oct. 2018.

* cited by examiner

SINGLE-ENDED BROKEN CONDUCTOR DETECTION LOGIC USING INCREMENTAL QUANTITIES

BACKGROUND

This disclosure relates to detecting a conductor breaking faults in electric power systems using incremental quantities.

Accurate detection of a conductor breaking in the power system allows concerned authorities to make repairs and restore power quickly. In some situation, such as when the broken conductor is in contact with the ground through a high-impedance media such as concrete or gravel, it may result in having very small conducting or arcing current. This may not be sufficient to be detected by many overcurrent protection systems. In addition, broken conductor faults at distribution level may be difficult to detect due to the relatively low voltages compared to transmission lines.

DETAILED DESCRIPTION

Figure 1:
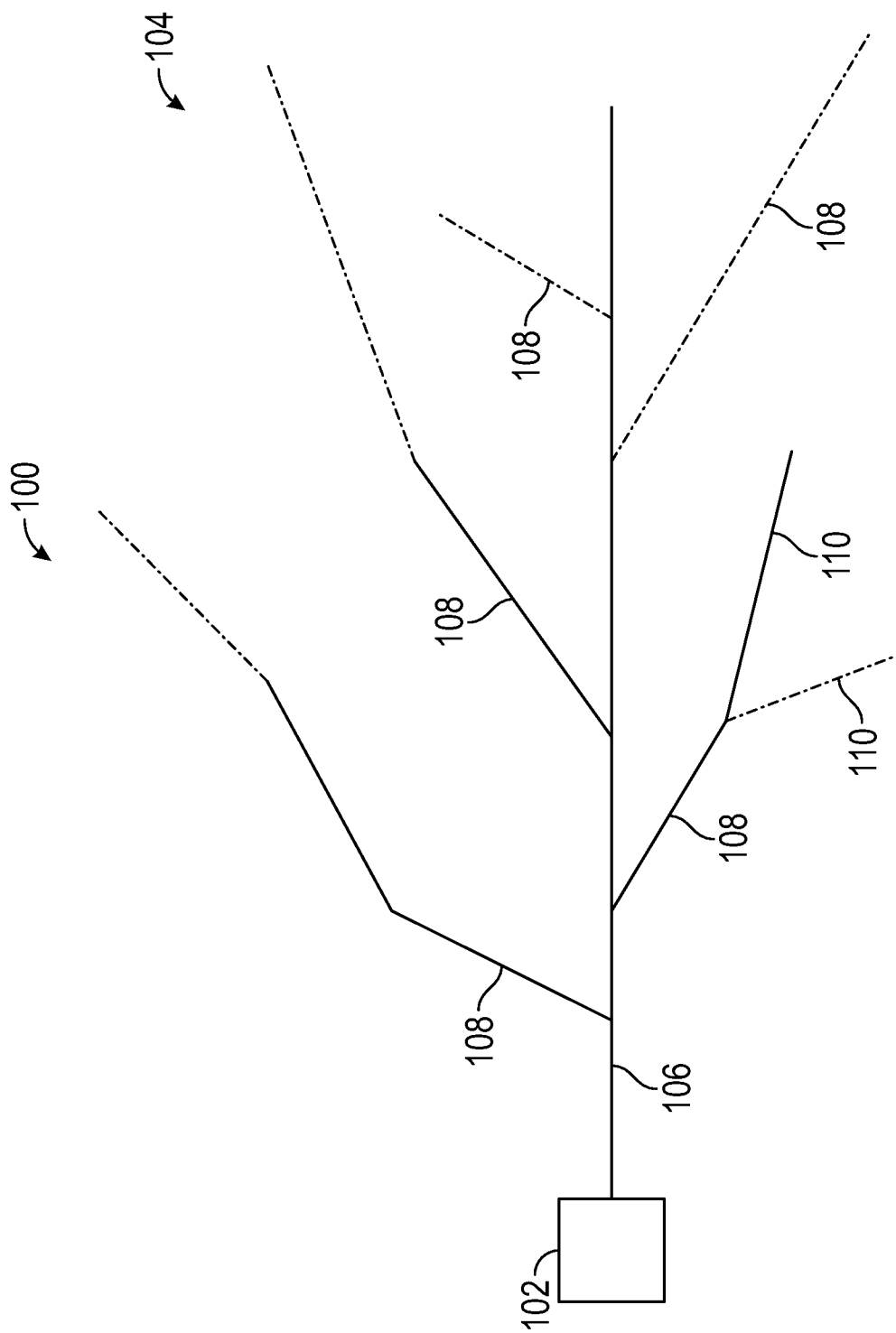
FIG. 1 is a block diagram of a power network, in accordance with an embodiment.

Faults in a power network may be detected by analyzing incremental quantities during a disturbance or fault, which are calculated by subtracting pre-fault quantities from faulted quantities. Incremental quantities during a disturbance or fault represent signals that appear in a pure-fault network of a power network. The pure-fault network is the difference between the faulted network and pre-fault network. The term "pre-fault network" refers to the power network before a fault occurred, and the term "faulted network" refers to the power network during the fault. These incremental quantities are typically represented with a prefix A to indicate the change with respect to the pre-fault signals. That is, the present disclosure solves for a pure-fault network. By way of example, electrical measurements associated with a loop in a multiple-phase electric power system may be obtained before a fault occurred on the loop (pre-fault sequence quantities) and during the fault occurred on the loop (faulted network sequence quantities), with the pre-fault sequence quantities and the faulted network sequence quantities synchronized. The differences between the electrical measurements are incremental quantities, which may give insight into information related to the fault. For instance, the incremental current quantity may be expressed as shown below:

$$\Delta I = I_{Fault} - I_{Pre-fault}, \quad (1)$$

where $I_{Fault}$ is the current measurement associated with the loop during the fault on the loop and $I_{Pre-fault}$ is the corresponding current measurement before the fault occurred on the loop.

In certain examples, sensors may be used to monitor an electric power system (e.g., electrical operating parameters). For instance, sensors (e.g., electrical sensors, temperature sensors, intelligent electronic devices (IEDs), and so forth) may be used and powered by the electric power system, or a battery (e.g., rechargeable battery, either standing alone or connected to a power system, which may be charged when power is available), or by an additional power supply (e.g., power backup system, solar panel power system or other alternative power system, and so forth), or any combination of these (e.g., converting to other power supply methods when there is an outage on one power supply). The sensors may be coupled to a monitoring system or may be stand-alone sensors. The sensors may be used to monitor the electric power system for a period of time. In certain examples, the sensors may measure values of electrical operating parameters of a particular loop (e.g., A-phase loop, B-phase loop, C-phase loop) in a multiple-phase electric power system (e.g., three-phase power network) and send the sensor data to an electrical monitoring system. As used herein, an IED may refer to any microprocessor-based device that monitors, controls, automates, and/or protects monitored equipment within the power system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system that includes multiple IEDs. The IEDs may obtain electric power system information using current transformers (CTs), potential transformers (PTs), Rogowski coils, voltage dividers and/or the like. The IEDs may use inputs from instrument transformers such as CTs and PTs used in monitoring of electric power delivery.

In certain examples, the electrical monitoring system may receive measurements of electrical operating parameters at a source terminal and a remote terminal on a particular loop before a fault occurred on the loop (pre-fault parameters), such that the fault occurred at a location between the source terminal and the remote terminal. The electrical monitoring system may then receive measurements of electrical operating parameters at the source terminal and the remote terminal of the particular loop during the fault on the loop. With this in mind, the electrical monitoring system may compare the values of the operating parameters measured at the source terminal (or the remote terminal) before the fault occurred on the loop and during the fault on the same loop to obtain respective incremental quantities for the source terminal (or the remote terminal).

The electrical monitoring system may monitor incremental quantities for source terminals and remote terminals on more than one loops in a multiple-phase electric power system. The electrical monitoring system may then use the incremental quantities to identify the fault. The electrical monitoring system may send instructions to activate certain actions (e.g., protective actions) based on the identified fault. In addition, each of these techniques may be performed continuously to provide for real-time monitoring and fault identification.

Various types of faults may occur in the power system. Unlike short-circuit faults that may be detected and cleared by overcurrent and earth fault protection, broken conductor faults are difficult to detect. For instance, when a broken conductor event occurs at a remote location on a lateral/distribution line, the value of electrical operating parameters (e.g., sequence currents) may be quite low and, hence, may be difficult to detect. Moreover, the charging current for distribution feeders and laterals may be very low and thus difficult to detect.

To overcome these difficulties, the systems of the present disclosure use incremental quantities to detect a conductor breaking in a power system. Conductor break may be detected before the conductor falls to the ground or becomes a shunt fault or a high-impedance fault.

By way of introduction, FIG. 1 illustrates a block diagram of a power network 100. The power network 100 may include generation, transmission, distribution and/or similar systems. In the illustrated example in FIG. 1, the power network 100 illustrates a generation system 102 coupled with a distribution feeder system 104. The distribution feeder system 104 include a main feeder line 106 and one or more lateral feeder lines 108 (e.g., distribution lines) splitting off the main feeder line 106. In FIG. 1, some lateral feeder lines 108 are three-phase power lines and indicated by solid lines, and some lateral feeder lines 108 are non-three-phase (e.g., single-phase, two-phase) power lines and indicated by dashed lines. Some of the lateral feeder lines 108 may have one or more sub-lateral feeder lines 110. The lateral feeder lines 108 and/or the sub-lateral feeder lines 110 may include one or more three-phase power lines, one or more two-phase power lines, one or more single-phase power lines, or any combination of them.

Figure 2:
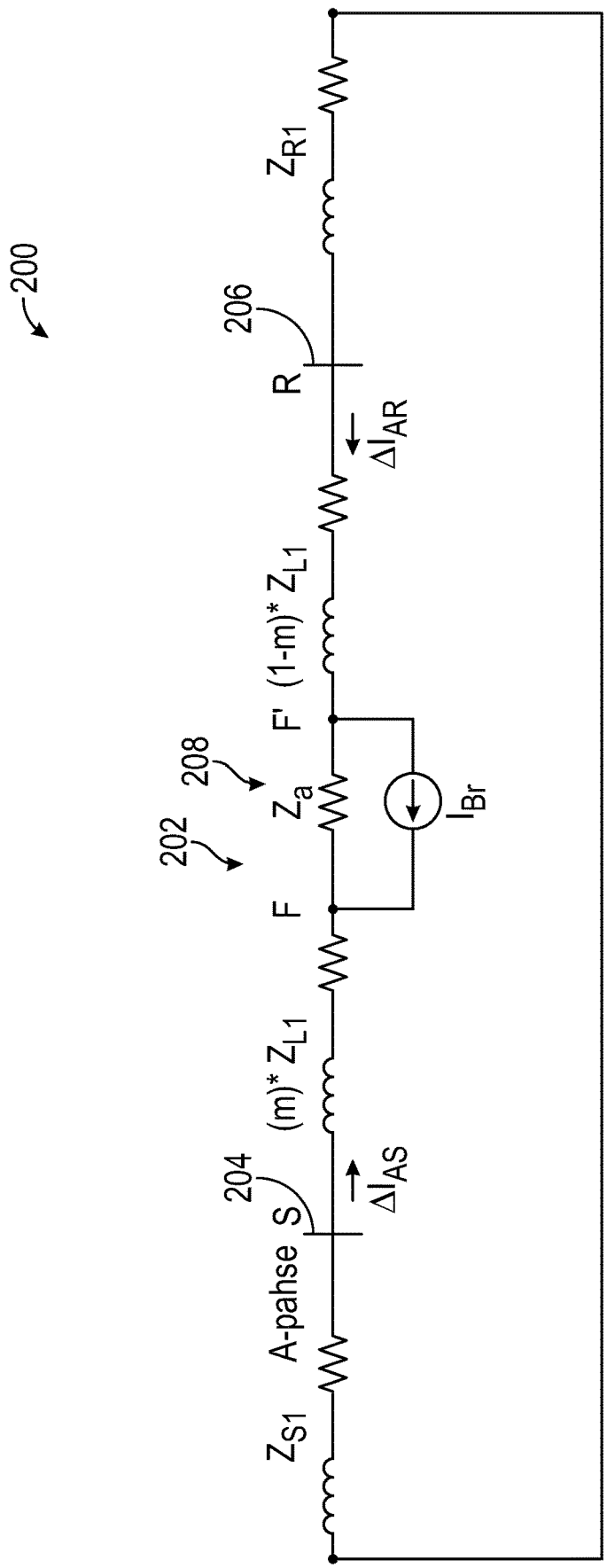
FIG. 2 illustrates a phase-based pure-fault power network, in accordance with an embodiment.

FIG. 2 illustrates the A-phase of a pure-fault power network 200 (e.g., three phase electric power system with phase A, phase B, and phase C) having an A-phase broken conductor fault. The A-phase of the pure-fault power network 200 may include a conductor 202, such as a transmission line connecting two nodes, which are illustrated as a source terminal (S) 204 and a remote terminal (R) 206. A conductor breaking 208 may occur on the transmission line at a location between F and F', and have a per unit distance m from the source terminal S 204 and a per unit distance (1−m) from the remote terminal R 206. The conductor breaking 208 can be represented as a current source $I_{Br}$ being applied at the location F-F', and $Z_a$ is the impedance between F and F' on the A loop. The magnitude of the current source $I_{Br}$ is equal to the decrease in the magnitude of A-phase current when it starts breaking and is in the direction opposite to the pre-fault A-phase current. All the other voltage sources in the pure-fault network are shorted.

According to equation (1), the incremental quantity of current at the source terminal S 204 may be illustrated by:

$$\Delta I_{AS} = I_{AS,fault} - I_{AS,pre-fault}, \qquad (2)$$

where $I_{AS,fault}$ is the current measurement associated with the A loop during the fault on the A loop and $I_{AS,pre-fault}$ is the corresponding current measurement before the fault occurred on the A loop. $Z_{1S}$ is the impedance of the source terminal (S) 204, $Z_{1R}$ is the impedance of the remote terminal (R) 206, and $Z_{L1}$ is the line impedance. For a distribution line system, $Z_{R1}$ may be assumed to be the representation of lumped load for the distribution line system. It should be noted that there may be a lateral feeder at the source terminal S 204 as well, which does not significantly influence the relationships described herein. Based on the phase-based pure-fault power network 200 illustrated in FIG. 2, a symmetrical (or sequence) components-based pure-fault power network may be illustrated, as in FIG. 3.

Figure 3:
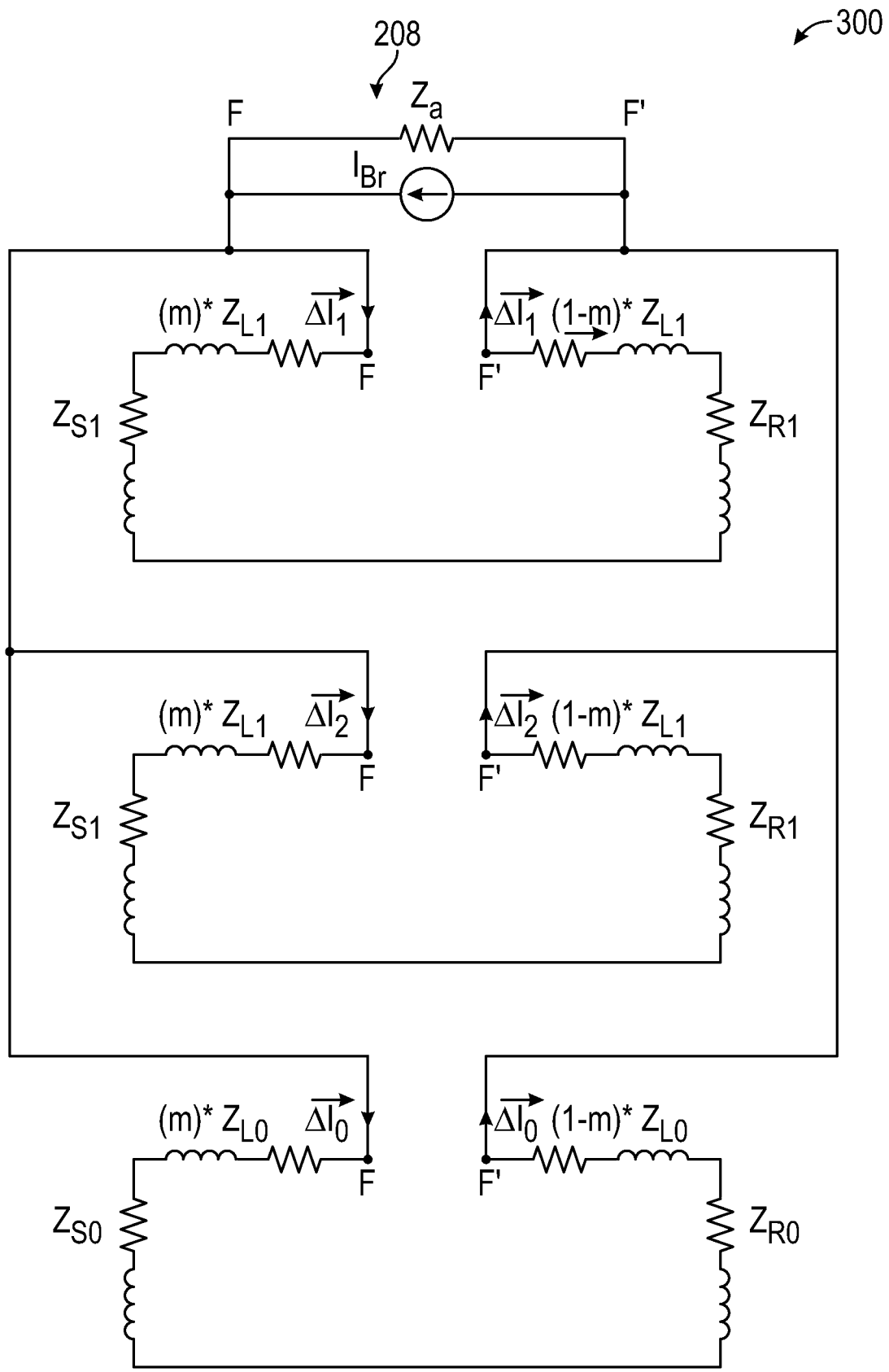
FIG. 3 illustrates a sequence-components-based pure-fault power network, in accordance with an embodiment.

FIG. 3 illustrates a symmetrical (or sequence) components-based pure-fault power network 300 for the conductor breaking 208. $Z_1$ is a total positive-sequence impedance between F and F', and $Z_2$ is a total negative-sequence impedance between F and F' and it is assumed that $Z_2$ equals to $Z_1$. $Z_0$ is a total zero-sequence impedance between F and F'. In FIG. 3, the relationships among the incremental quantities may be illustrated in equations (3) and (4):

$$\frac{\Delta I_2}{\Delta I_1} \sim 1 \qquad (3)$$

$$\frac{\Delta I_0}{\Delta I_1} \sim \frac{Z_1}{Z_0}, \qquad (4)$$

where $\Delta I_0$, $\Delta I_1$, and $\Delta I_2$ are the incremental quantities of current for the zero-sequence, the positive sequence, and the negative sequence, respectively. Based on the relationships among the incremental quantities illustrated above in the equations (3) and (4), methods with various expressions may be used to detect conductor breaking fault. For example, a value RatioD may be used to detect the conductor breaking 208, and the RatioD may have the expression as:

$$RatioD = \frac{|\Delta I_0| + |\Delta I_2|}{|\Delta I_1|}. \qquad (5)$$

Based on the equations (3) and (4), the value RatioD may be explained as:

$$\frac{|\Delta I_0| + |\Delta I_2|}{|\Delta I_1|} = \frac{|\Delta I_2|}{|\Delta I_1|} + \frac{|\Delta I_0|}{|\Delta I_1|} = 1 + \frac{|Z_1|}{|Z_0|}. \qquad (6)$$

Generally, the value of $|Z_1|/|Z_0|$ is close to $$\frac{|Z_1|}{|Z_0|} \text{ is close to } 1/3 \left( \frac{|Z_1|}{|Z_0|} \sim 1/3 \right).$$

For distribution systems, this value can vary significantly based on the system being analyzed. A lower limit of $$\frac{|Z_1|}{|Z_0|} = 1/5$$

provides a good margin for such systems. Accordingly, the value RatioD for the conductor breaking 208 in the power system may generally have a relationship as:

$$\text{RatioD} > 1.2 \quad (7).$$

Figure 5:
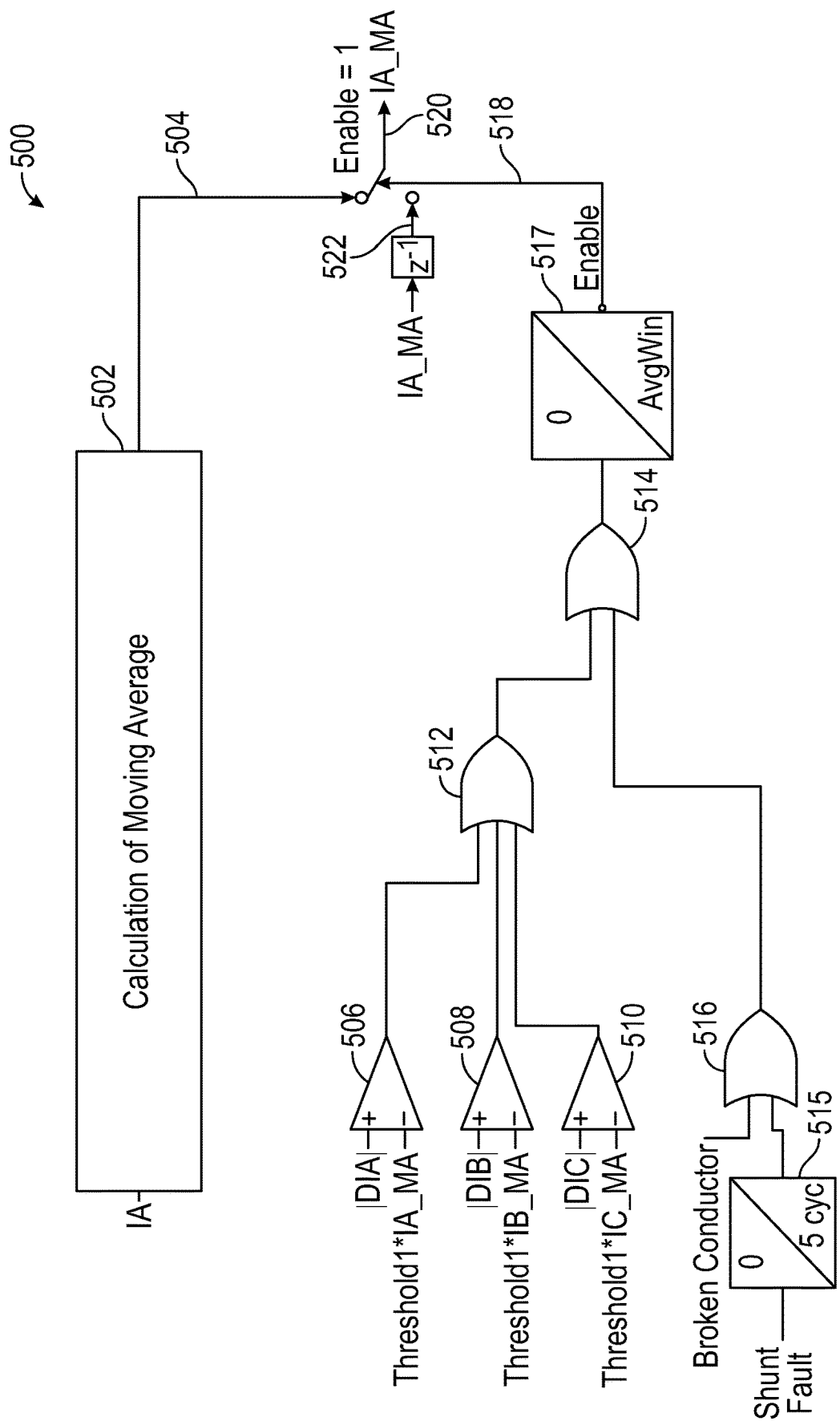
FIG. 5 is a block diagram illustrating a determination of a moving average of a quantity, in accordance with an embodiment.
Figure 6:
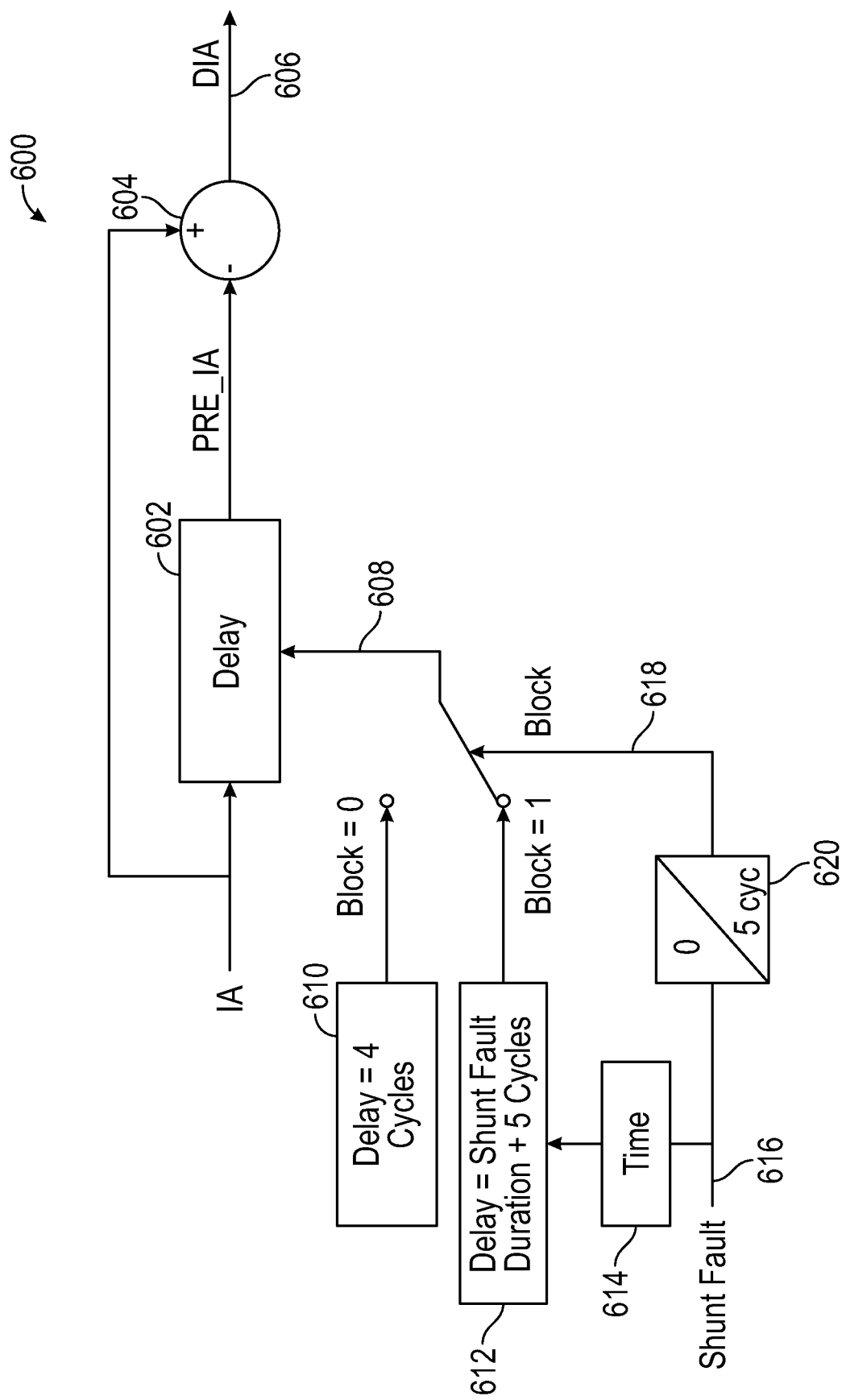
FIG. 6 is a block diagram illustrating a calculation of an incremental quantity, in accordance with an embodiment.

When a conductor breaking occurs, the magnitude of the incremental quantities of the current for corresponding phase (e.g., phase A($|\Delta I_A|$), phase B($|\Delta I_B|$), or phase C ($|\Delta I_C|$)) starts increasing, which may be monitored using a relationship (8):

$$|\Delta I_{Ph}| > \text{threshold1} * |I_{Ph-MA}|. \quad (8)$$

where $|\Delta I_{Ph}|$ is the magnitude of the incremental quantity of the current for a phase (e.g., $|\Delta I_A|$, $|\Delta I_B|$, $|I_C|$), $|I_{Ph-MA}|$ is the magnitude of the moving average of the corresponding pre-fault phase current (e.g., $|I_{A-MA}|$, $|I_{B-MA}|$, $|I_{C-MA}|$), and threshold1 has a value within a range of 2% to 10%. When the conductor breaking occurs, the magnitude of the incremental quantity of the current for a phase (e.g., $|\Delta_A|$, $|\Delta I_B|$, $|\Delta I_C|$) may be greater than 2% to 10% of the magnitude of the moving average of the corresponding pre-fault phase current (e.g., $|I_{A-MA}|$, $|I_{B-MA}|$, $|I_{C-MA}|$). The moving average current magnitude is a representation of the magnitude of steady state current before a disturbance (e.g., before a fault occurs). The determination of the moving average current magnitude is illustrated in FIG. 5, and the calculation of the incremental quantities is illustrated in FIG. 6.

In the illustrated example above, when the magnitude of the incremental quantity of the current for a phase (e.g., $|\Delta I_A|$, $|\Delta I_B|$, $|\Delta_C|$) is greater than the magnitude of the moving average of the corresponding pre-fault phase current (e.g., $|I_{A-MA}|$, $|_{B-MA}|$, $|_{C-MA}|$), the power system may be experiencing a shunt fault (e.g., short circuit between a conductor and ground or short circuit between two or more conductors). Accordingly, a relationship may be used to eliminate occurrences of other faults (e.g., shunt fault):

$$|\Delta I_{Ph}| < \text{threshold2} * |I_{Ph-MA}|, \quad (9)$$

where the threshold2 has a value more than 1 (e.g., 1.1). That is, when the above relationship (9) is satisfied, there may be a conductor breaking occurring rather than a shunt fault occurring in the power system. Accordingly, there may be a shunt fault when:

$$|\Delta I_{Ph}| > \text{threshold2} * |I_{Ph-MA}|. \quad (10)$$

Figure 4:
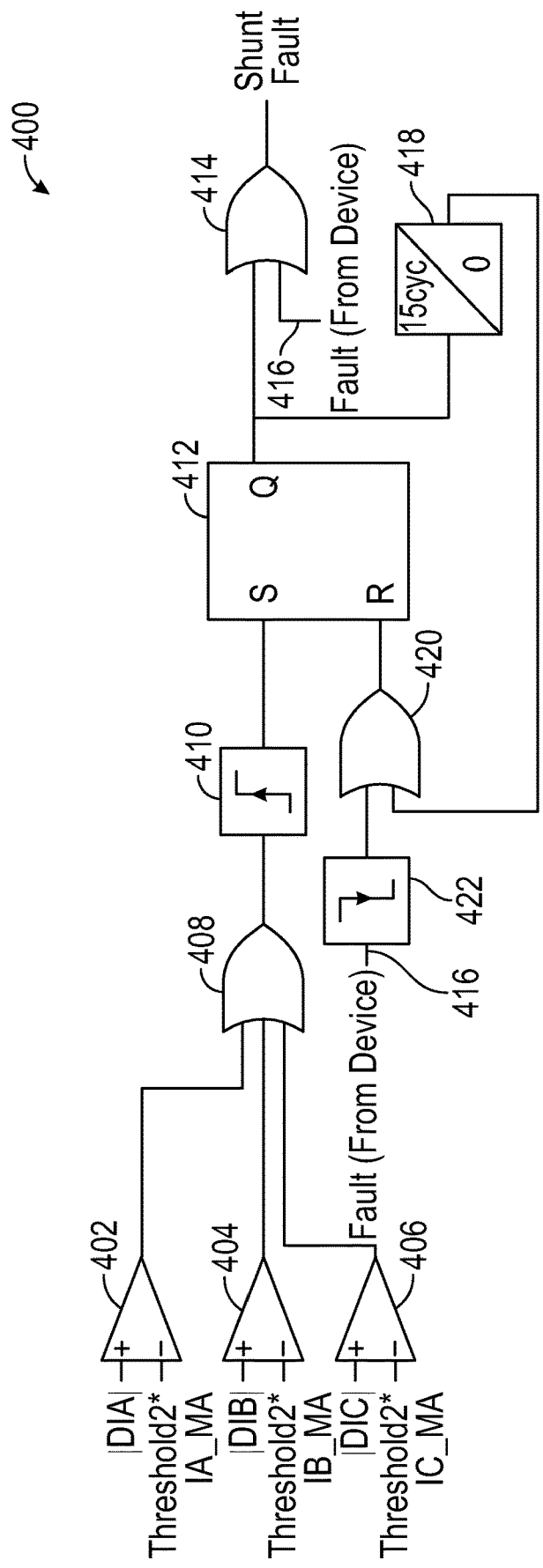
FIG. 4 is a block diagram of detection logic for a shunt fault, in accordance with an embodiment.

For instance, FIG. 4 shows a block diagram 400 used to illustrate an example of a detection logic for a shunt fault, which may be used in related circuitry for detecting the shunt fault logic (e.g., in circuitry monitoring the power system or as instructions executed on processing circuitry such as a processor). In FIG. 4, comparators 402, 404, and 406 may be used to monitor the relationship (10) for phase A, B, and C, respectively. In FIG. 4, terms "|DIA|", "|DIB|", and "|DIC|" represent the magnitudes of the incremental quantities of the current for the phase A, the phase B, and the phase C (e.g., $|I_A|$, $|I_B|$, $|\Delta I_C|$), respectively. In FIG. 4, terms "IA_MA", "IB_MA", and "IC_MA" represent the magnitudes of the moving average of the pre-fault phase currents for the phase A, phase B, and phase C (e.g., $|I_{A\_MA}|$, $|I_{B-MA}|$, $|I_{C-MA}|$), respectively. When the relationship (10) for a phase (e.g., phase A, phase B, phase C) is satisfied, a corresponding output indicating logic high (e.g., "1") is transmitted to an OR gate 408, which in response outputs a logic high to a rising edge detector 410. When the rising edge detector 410 detects the rising edge caused by the output from the OR gate 408, it outputs a signal with logic high to an input S of a SR latch 412 having an initial state with an output Q having a value of 0. The SR latch 412 may output (from the output Q) a logic high (depends on the state of input R) to an OR gate 414, and, in response, the OR gate 414 outputs a logic high indicating a shunt fault event.

Alternatively, or additionally, a signal 416 transmitted from a device (e.g., other fault detecting sensors, devices, or input device operated by an operator) may send information about the shunt fault to the OR gate 414. Accordingly, in the illustrated example in FIG. 4, even when none of the phases satisfy the relationship (10), the OR gate 414 may still output a signal with logic high indicating the detection of the shunt fault from the device. The output from the SR latch 412 may be transmitted to a programmable delay pickup and drop out logic unit 418. When no shunt fault is detected, the SR latch outputs a logic low to the programmable delay pickup and drop out logic unit 418, which outputs a logic low to the OR gate 420. When a shunt fault is detected, the SR latch outputs a logic high to the programmable delay pickup and drop out logic unit 418, which delays the output from the SR latch 412 for a certain number of time cycles (e.g., 15 cycles in FIG. 4) before outputs it to the OR gate 420. The certain number of time cycles may be determined based on the properties of the power system; for example, the time generally taken to clear the fault in the power system. After the certain number of time cycles (e.g., 15 cycles) since the detection of the shunt fault, the programmable delay pickup and drop out logic unit 418 outputs a logic high (e.g., 1) to the OR gate 420, which in response output a logic high to the input R of the SR latch 412 to reset the SR latch 412 so that the output Q may response to the change of the input S.

As discussed above, when the signal 416 is transmitted from the device indicating the shunt fault (e.g., logic high) event, the output from the OR gate 414 is high even when the output Q of the SR latch 412 is low. In addition, the signal 416 transmitted from the device is transmitted to a falling edge detector 422, which outputs a signal to the OR gate 420 together with the output from the programmable delay pickup and drop out logic unit 418. The falling edge detector 422 outputs a logic high when a falling edge of the signal 416 transmitted from the device is detected, indicating that the fault detected by the device is cleared. Accordingly, when a falling edge of the signal 416 transmitted from the device is detected by the falling edge detector 422, the OR gate 420 may output a logic high to the input R of the SR latch even when the output of the programmable delay pickup and drop out logic unit 418 is low (e.g., when it is less than the certain number of time cycles since the shunt fault was detected). That is, the SR latch 412 may be reset by the output from the programmable delay pickup and drop out logic unit 418 or by the signal 416 transmitted from the device.

Figure 10:
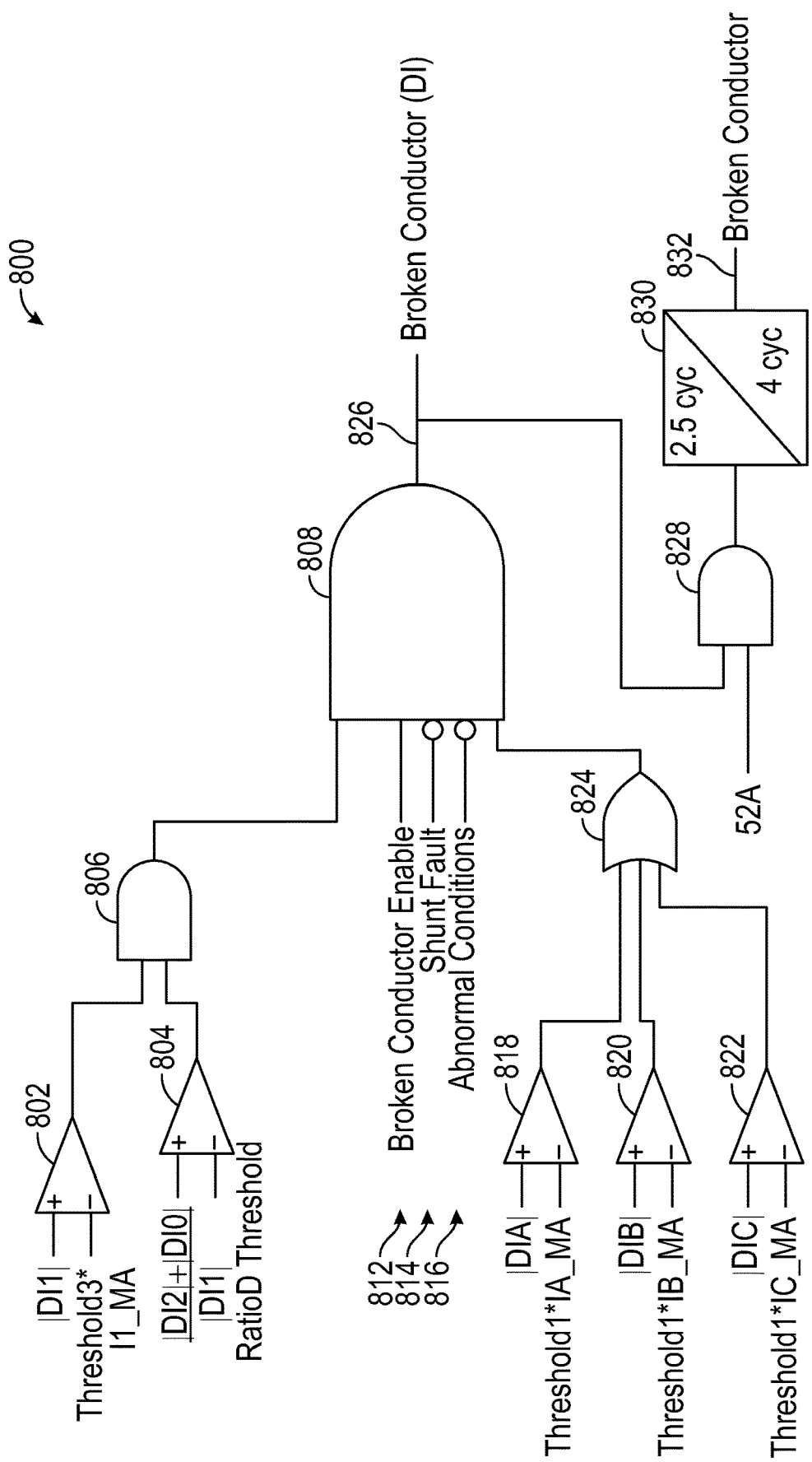
FIG. 10 is a block diagram of detection logic for a fault, in accordance with an embodiment.

As discussed above with reference FIG. 4, when the shunt fault is detected, the SR latch 412 may not be reset for the certain number of time cycles (e.g., 15 cycles) to allow the fault to be cleared. In addition, if the signal 416 transmitted from the device indicating that the fault detected by the device is cleared (e.g., a falling edge is detected by the falling edge detector 422), the shunt fault detection logic in the block diagram 400 may be reset and used for detecting before finishing the certain number of time cycles. That is, a temporary fault may be detected by the shunt fault detection logic illustrated in FIG. 4, and the shunt fault detection logic may be reset after the fault is cleared. The output from the OR gate 414 may be used to calculate the moving average current magnitudes or the incremental quantities, or block a broken conductor logic, as illustrated in FIG. 5, FIG. 6, and FIG. 10, respectively.

FIG. 5 shows a block diagram 500 to illustrate a method for the computation of the moving average current magnitude "IA_MA" for the A-phase "IA" of the power system, with an averaging window of "AvgWin" number of time cycles (e.g., 4 cycles). Although the computation of the moving average current magnitude for the A-phase of the power system is illustrated in FIG. 5, the computation of the moving average current magnitude for B-phase and C-phase (e.g., "IB_MA" and "IC_MA") and positive sequence current may use the same method and logic illustrated in FIG. 5.

In FIG. 5, a circuit 502 is used to conduct the calculation of moving average for the A-phase current "IA", and the output 504 is the calculated moving average current magnitude. In FIG. 5, comparators 506, 508, and 510 are used to monitor the relationship (8) for phase A, B, and C, respectively. Similar to FIG. 4, in FIG. 5, terms "|DIA|", "|DIB|", and "|DIC|" represent the magnitudes of the incremental quantities of the current for the phase A, the phase B, and the phase C (e.g., $|\Delta I_A|$, $|\Delta I_B|$, $|\Delta I_C|$), respectively. In FIG. 5, terms "IA_MA", "IB_MA", and "IC_MA" represent the magnitudes of the moving average of the pre-fault phase currents for the phase A, phase B, and phase C (e.g., $|I_{A\_MA}|$, $|I_{B\_MA}|$, $|I_{C\_MA}|$), respectively. When the relationship (8) for a phase (e.g., phase A, phase B, phase C) is satisfied, a corresponding output indicating a logic high (e.g., "1") is transmitted to an OR gate 512, which in response outputs a logic high to an OR gate 514.

In addition, in FIG. 5, an OR gate 516 is used to monitor a broken conductor fault signal (e.g., the output of the detection logic illustrated in FIG. 10) and a shunt fault signal (e.g., the output of the OR gate 414 in FIG. 4). For the shunt fault signal, a programmable delay pickup and drop out logic unit 515 is used to control a delay of the shunt fault signal. For instance, when there is no shunt fault detected, e.g., the shunt fault signal is 0, the programmable delay pickup and drop out logic unit 515 outputs a logic low to the OR gate 516. When a shunt fault is detected (e.g., the shunt fault signal is 1), the programmable delay pickup and drop out logic unit 515 outputs a logic high during the period of the shunt fault duration and during an additional number of time cycles (e.g., additional 5 time cycles are used in the example illustrated in FIG. 5) after the shunt fault is cleared (during which time the shunt fault signal is 0). The output of the OR gate 516 is transmitted to the OR gate 514. The output of the OR gate 514 is transmitted to a programmable delay pickup and drop out logic unit 517, which is used to control a delay associated with the fault detected either by the incremental quantities (e.g., when the output of the OR gate 512 is high), or indicated by the broken conductor fault signal or the shunt fault signal (e.g., when the output of the OR gate 516 is high). A signal 518, which is the inversion of the output from the programmable delay pickup and drop out logic unit 517, is used as an enable signal for the IA_MA output 520.

In FIG. 5, when an event is detected either by way of the incremental quantities (e.g., when the output of the OR gate 512 is high) or detected by the broken conductor logic or the shunt fault logic (e.g., when the output of the OR gate 516 is high), the OR gate 514 may output a logic high to the programmable delay pickup and drop out logic unit 517, which outputs a logic high and continues to output the logic high for an additional "AvgWin" window, even when the output of the OR gate 514 changes to a logic low during the "AvgWin" window. Accordingly, the signal 518 has a value of 0 during these periods, which enables a signal 522, representing the moving average magnitude of the current of phase A before the fault occurs, to be transmitted to the IA_MA output 520. When there is no fault detected, the OR gate 514 output a logic low to the programmable delay pickup and drop out logic unit 517, which outputs a logic low. Accordingly, the signal 518 has a value of 1, which enables the signal of the calculated moving average current magnitude 504 to be transmitted to the IA_MA output 520. That is, the moving average current magnitude is calculated using the corresponding pre-fault phase current. Accordingly, the moving average current magnitude is a representation of the magnitude of steady state current before a disturbance (e.g., before a fault occurs).

FIG. 6 shows a block diagram 600 to illustrate a method for the computation of the incremental quantities. The A-phase incremental quantity is calculated using the equation (2) and is illustrated in FIG. 6. A delay 602 is used to receive 'past' A-phase current (PRE IA), which is subtracted from the 'present' A-phase current (IA) at a subtraction block 604. The output 606 (DIA) from the subtraction block 604 is the incremental quantity for the A-phase incremental quantity of current. The delay used in the delay 602 is determined by a signal 608. When there is no fault detected (e.g., Block=0), the delay used in the delay 602 is a specified (e.g., predetermined) period generated by the block 610 (e.g., 4 time cycles used in the example illustrated in FIG. 6). When there is a shunt fault detected (e.g., Block=1), the delay used in the delay 602 may be a summation of the duration of the shunt fault period and a particular number of time cycles (e.g., 5 time cycles used in the example illustrated in FIG. 6) generated by the block 612 and a time measurement unit 614 based on the shunt fault signal 616 (e.g., the output of the OR gate 414 in FIG. 4). The signal 608 may be controlled by a blocking signal 618 having a value of Block (e.g., Block may be 1 or 0). The blocking signal 618 may be generated by a programmable delay pickup and drop out logic unit 620. Similar to the programmable delay pickup and drop out logic unit 515 in FIG. 5, the programmable delay pickup and drop out logic unit 620 outputs a logic high (e.g., 1) to the signal 618 during the period of the shunt fault duration and the additional number of time cycles (e.g., 5 time cycles in the example illustrated in FIG. 6). At the time other than the period of the shunt fault duration and the additional number of time cycles, the programmable delay pickup and drop out logic unit 620 outputs a logic low (e.g., 0) to the signal 618. Although the computation of the incremental quantity of current for the A-phase of the power system is illustrated in FIG. 6, the computation of the incremental quantity of current for B-phase and C-phase (e.g., "DIB" and "DIC") and sequence incremental quantities (e.g., "DI0", "DI1", "DI2") may use the same method and logic illustrated in FIG. 6.

The value RatioD defined by the equation (5) may have different values for different types of faults. Table 1, shown below, may be used to illustrate the various values of the value RatioD and corresponding faults.

TABLE 1

| RatioD | ≈0 | ≈1 | ≈1.33 | ≈2 |
|---|---|---|---|---|
| Type of Fault | 3P, Load switching-balanced | LL, LLG | Conductor breaking | SLG, Load switching-unbalanced |

Figure 7:
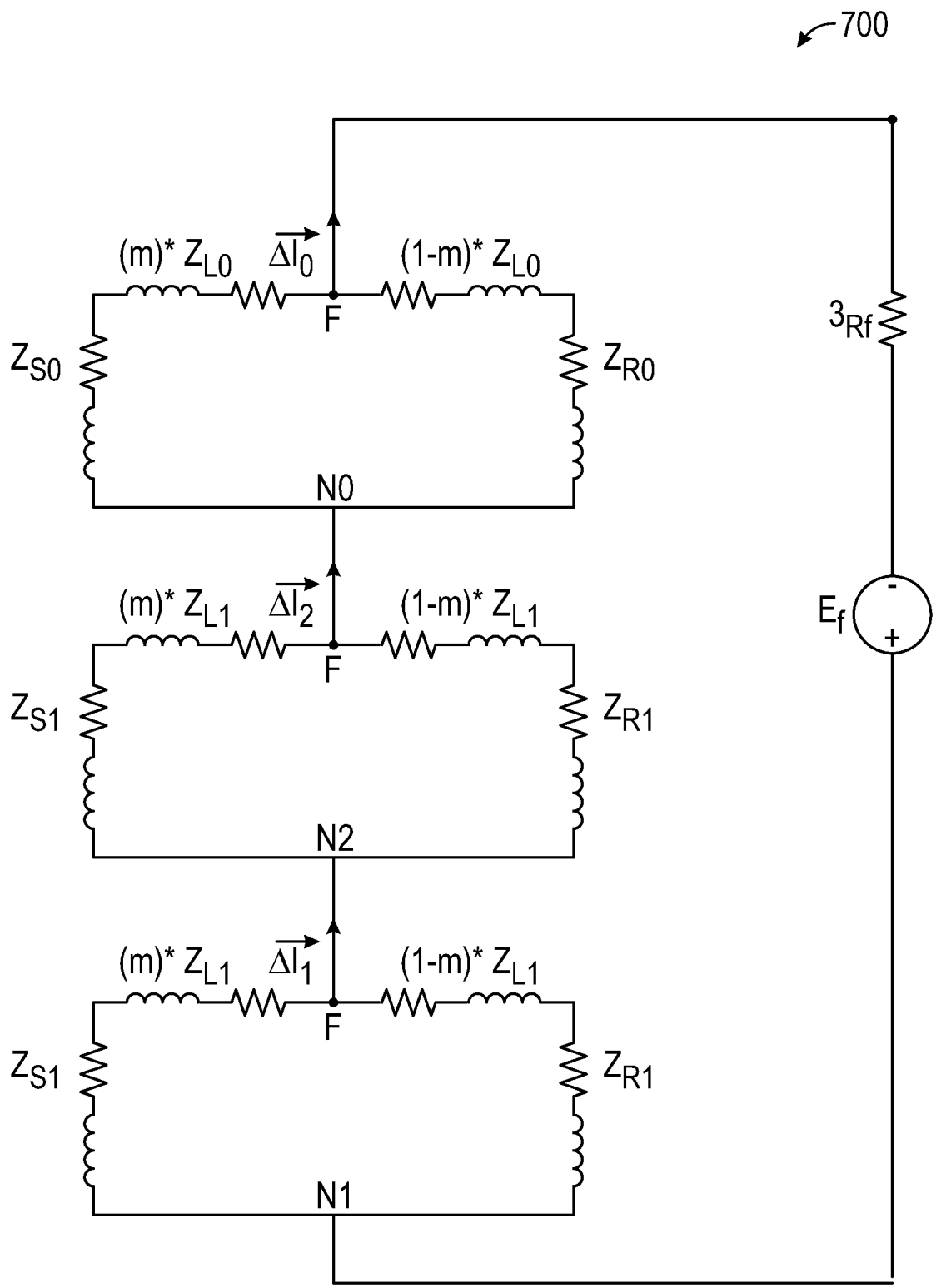
FIG. 7 illustrates a second embodiment of a sequence-components-based pure-fault power network, in accordance with an embodiment.
Figure 8:
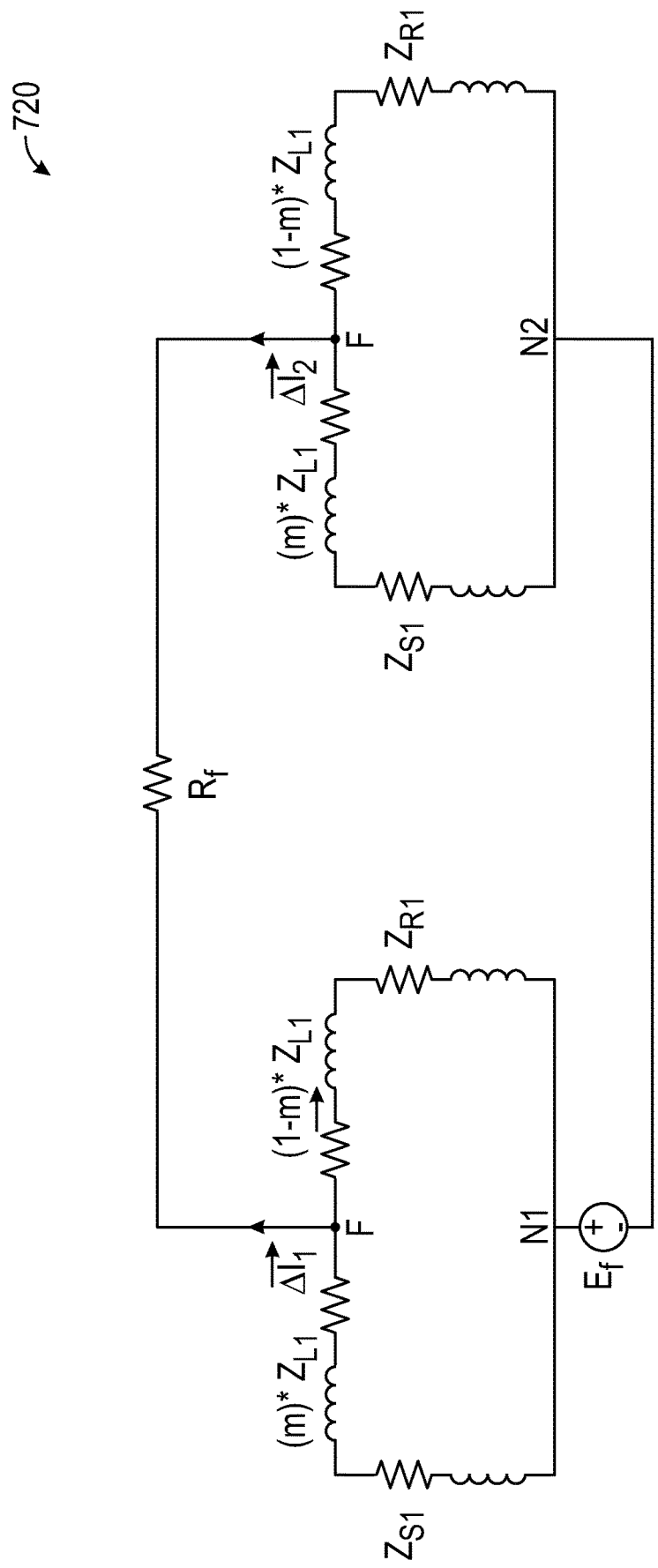
FIG. 8 illustrates a third embodiment of a sequence-components-based pure-fault power network, in accordance with an embodiment.
Figure 9:
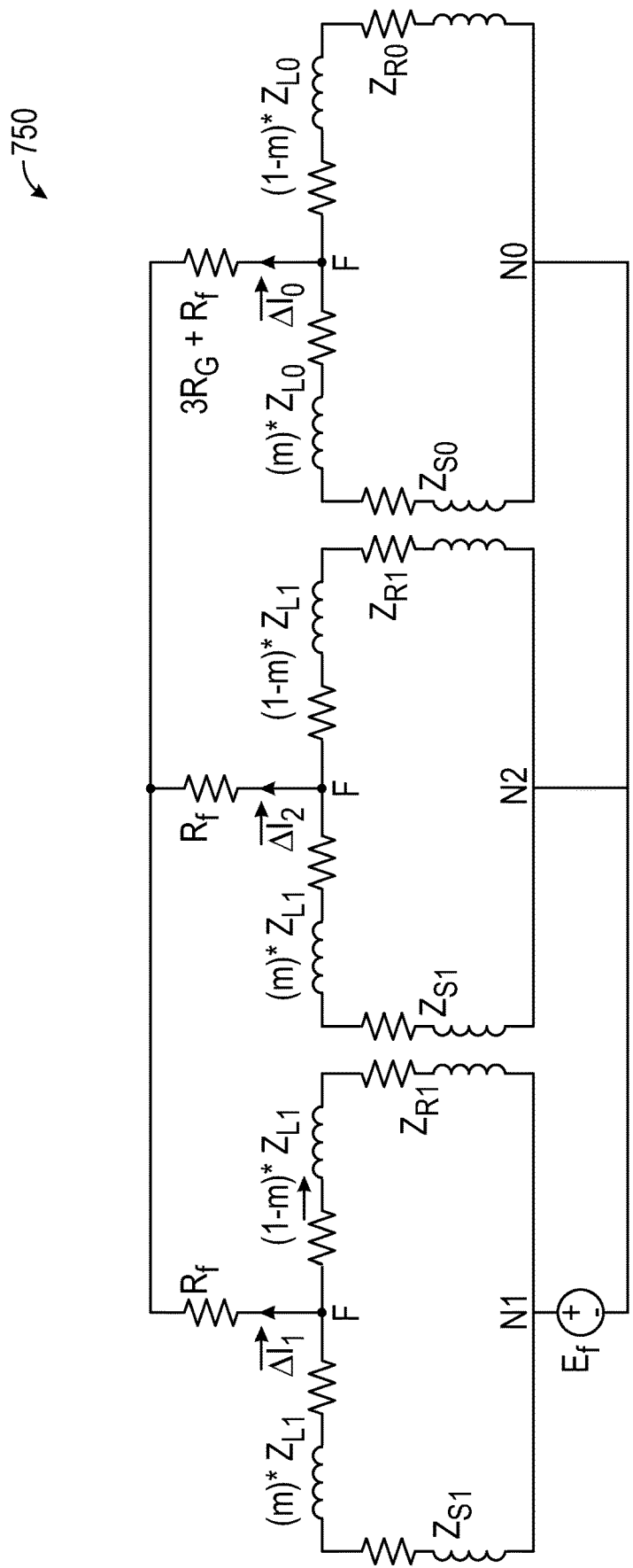
FIG. 9 illustrates a fourth embodiment of a sequence-components-based pure-fault power network, in accordance with an embodiment.

FIGS. 7-9 illustrate pure-fault sequence networks for different types of faults corresponding to different values of the value RatioD, as described by Table 1.

FIG. 7 illustrates a symmetrical (or sequence) components-based pure-fault power network 700 for a Single Line to Ground (SLG) fault. In FIG. 7, $E_f$ is a fault generated voltage and $R_f$ is a fault generated impedance. The value RatioD for the SLG fault is illustrated by:

$$RatioD = \frac{|\Delta I_0| + |\Delta I_2|}{|\Delta I_1|} = \frac{|\Delta I_1| + |\Delta I_1|}{|\Delta I_1|} \approx 2. \quad (11)$$

FIG. 8 illustrates a symmetrical (or sequence) components-based pure-fault power network 720 for a Line to Line (LL) fault. The value RatioD for the LL fault is illustrated by:

$$RatioD = \frac{|\Delta I_0| + |\Delta I_2|}{|\Delta I_1|} = \frac{|\Delta I_2|}{|\Delta I_1|} \approx 1. \quad (12)$$

FIG. 9 illustrates a symmetrical (or sequence) components-based pure-fault power network 750 for a Double Line to Ground (LLG) fault. In FIG. 9, $R_G$ is the phase to ground impedance during the fault. The value RatioD for the LLG fault is illustrated by:

$$RatioD = \frac{|\Delta I_0| + |\Delta I_2|}{|\Delta I_1|} = \frac{|\Delta I_1|}{|\Delta I_1|} \approx 1. \quad (13)$$

For a 3-Phase (3P) fault, the value RatioD is illustrated by:

$$RatioD = \frac{|\Delta I_0| + |\Delta I_2|}{|\Delta I_1|} = \frac{0}{|\Delta I_1|} \approx 0. \quad (14)$$

For a balanced load switching, the value RatioD is illustrated by:

$$RatioD = \frac{|\Delta I_0| + |\Delta I_2|}{|\Delta I_1|} = \frac{0}{|\Delta I_1|} \approx 0. \quad (15)$$

For a single-phase load switching, the value RatioD is illustrated by:

$$RatioD = \frac{|\Delta I_0| + |\Delta I_2|}{|\Delta I_1|} = \frac{|\Delta I_A + a*a*\Delta I_B + a*\Delta I_C|+|\Delta I_A|+|\Delta I_A+a*\Delta I_B+a*a*\Delta I_C|}{|\Delta I_A + a*\Delta I_B + a*a*\Delta I_C|} = \frac{|\Delta I_A|}{|\Delta I_A|} \approx 2. \quad (16)$$

A conductor breaking detection logic may utilize the above relationships for detecting a conductor breaking fault, as illustrated in FIG. 10.

In addition, when a conductor break occurs, the magnitude of the positive sequence incremental quantity may be monitored using a relationship (17):

$$|\Delta I_1| > \text{threshold3} * |I_{1\_MA}|, \quad (17)$$

where threshold3 may be in a specified range (e.g., 1-5%). This means that the positive sequence incremental quantity magnitude III should be greater than a certain percentage (threshold3) of the positive sequence current moving average magnitude $|I_{1\_MA}|$. The relationship (17) is used to assure that the detection logic may not be operated when the device is measuring noise and the denominator of RatioD in equation (5) is not close to 0.

Accordingly, the equations or relationships (5)-(17) described above may be utilized in the detection logic for a conductor breaking. FIG. 10 shows a block diagram 800 to illustrate a detection logic for a conductor breaking. In FIG. 10, a comparator 802 may be used to monitor the magnitude of the incremental quantity of the positive sequence current based on the relationship (17), and a value of 2% is used for the threshold3 in the example illustrated in FIG. 10. In FIG. 10, the term "|DI1|" represents the positive sequence incremental quantity magnitude $|\Delta I_1|$, and the term "I1_MA" represents the positive sequence current moving average magnitude $|I_{1\_MA}|$. When the relationship (17) is satisfied, the comparator 802 outputs a logic high. In FIG. 10, a comparator 804 may be used to monitor the value of RatioD. In FIG. 10, "RatioD threshold" may represent any value that satisfies the relationship (7). When the relationship is satisfied, the comparator 804 outputs a logic high. The output of the comparators 802 and 804 are transmitted to an AND gate 806. Accordingly, the AND gate 806 outputs a logic high signal when the outputs from the comparators 802 and 804 are both at logic high (e.g., both the relationship (17) and the relationship of the value RatioD (e.g., RatioD>1.2) are satisfied). The output of the AND gate 806 is transmitted to an AND gate 808, which is used to detect the broken conductor.

In FIG. 10, a signal 812 is used as the enable signal to permit broken conductor logic which enables an AND gate, a signal 814 is used to indicate the shunt fault (e.g., the output from the OR gate 414 in FIG. 4), and a signal 816 is used to indicate abnormal conditions (e.g., HIF (High Impedance Fault), Inrush current or switch-on surge, load switching). An inversion of the signal 814 and an inversion of the signal 816 are transmitted to the AND gate 808 to block the broken conductor detection logic when a shunt fault occurs (e.g., when the signal 814 has a logic high) or any abnormal condition occurs (e.g., when the signal 816 has a logic high).

In FIG. 10, comparators 818, 820, and 822 are used to monitor the relationship (8) for phase A, B, and C, respectively. When a conductor breaking occurs, the magnitude of the incremental quantities of the current for phase A ($|\Delta I_A|$), phase B ($|\Delta I_B|$), or phase C ($|\Delta I_C|$) starts increasing and may be monitored by the relationship (8). Similar to FIG. 5, terms "|DIA|", "|DIB|", and "|DIC|" represent the magnitudes of the incremental quantities of the current for the phase A, the phase B, and the phase C (e.g., $|\Delta I_A|$, $|\Delta I_B|$, $|DI_C|$), respectively. In FIG. 10, terms "IA_MA", "IB_MA", and "IC_MA" represent the magnitudes of the moving average of the pre-fault phase currents for the phase A, phase B, and phase C (e.g., $|I_{A\_MA}|$, $|I_{B\_MA}|$, $|I_{C\_MA}|$, respectively. When the relationship (8) (threshold1 is set to 5% in the example illustrated in FIG. 10) for a phase (e.g., phase A, phase B, phase C) is satisfied, a corresponding output indicating a logic high (e.g., "1") is transmitted to an OR gate 824, which in response outputs a logic high to the AND gate 808.

Accordingly, the detection logic in FIG. 10 utilizes the relationship (8) to monitor the magnitude of the incremental quantities of the current for phases of the power system, the relationship (17) to monitor the magnitude of the incremental quantity of the positive sequence current, and the value of the value RatioD to monitor the conductor breaking. Accordingly, the output 826 from the AND gate 808 has a logic high only when a conductor breaking occurs, and the detection logic in FIG. 10 may be blocked (e.g., the output 826 from the AND gate 808 may not be used to detect the breaking conductor) when a load switching occurs, a shunt fault occurs, or an abnormal condition occurs. The output 826 is transmitted to an AND gate 828 together with a breaker status signal 52A. The breaker status signal 52A monitors the status of a breaker. When one or more phases of the breaker are open, the signal 52A has a logic low value. When all phases of the breaker are closed, the breaker status signal 52A has a logic high value. Accordingly, the breaker status signal 52A is used to monitor the status of the breaker and confirm that the breaker is closed when the output 826 has a logic high. The output of the AND gate 828 is transmitted to a programmable delay pickup and drop out logic unit 830 for delay control purpose, which outputs a signal 832 indicating a broken conductor fault.

Figure 11:
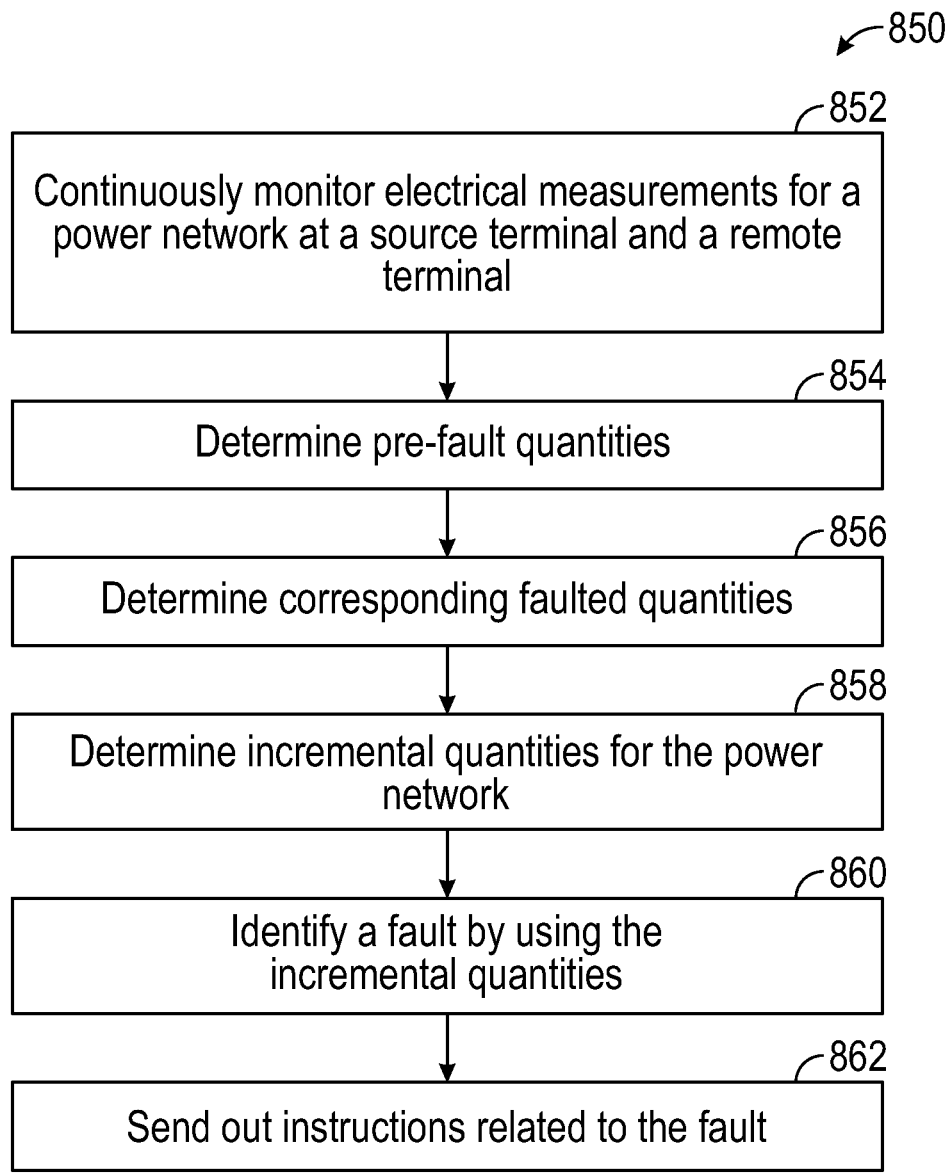
FIG. 11 is a flowchart of a method used to detect a fault, in accordance with an embodiment.

FIG. 11 illustrate a flow chart of a method 850 used to detect a fault. Although the method 850 is described as being performed in a particular order, the method 850 may be performed in any suitable order. Moreover, the method 850 may be performed by any suitable computing system that may have certain processing capabilities. Further, the flow chart in FIG. 11 may be refined or enhanced based on system constraints.

For instance, the computing system may include a communication component, processing circuitry such as a processor, a memory, a storage, input/output (I/O) ports, a display, and the like. The communication component may facilitate communication between the computing system and other suitable communication-enabled devices.

The processor may be any processing device capable of executing computer-executable code including, for example a processor, a microprocessor, a field-programmable gate array (FPGA), an application-specific integrated circuit (ASIC) or the like, including combinations of one or more processing devices. The processor may also include multiple processors that may perform the operations described below. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may store data, various other software applications for analyzing the data, and the like. The memory and the storage may represent non-transitory computer-readable media (e.g., any suitable form of memory or storage) that may store the processor-executable code used by the processor to perform various techniques described herein. It should be noted that non-transitory indicates that the media is tangible and not merely a signal.

The I/O ports may be interfaces that may couple to other peripheral components such as input devices (e.g., keyboard, mouse), sensors, input/output (I/O) modules, and the like. The display may operate to depict visualizations associated with software or executable code being processed by the processor. In an example, the display may be a touch display capable of receiving inputs from a user. The display may be any suitable type of display, such as a liquid crystal display (LCD), plasma display, or an organic light emitting diode (OLED) display, for example.

Referring now to FIG. 11, at block 852, the computing system may continuously or periodically monitor the real-time and synchronized signals of electrical measurements for the power network. The electrical measurements may include voltage measurements, current measurements, or the like in accordance with the equations described above. The data related to the electrical measurements may be sent to the computing system.

At block 854, the computing system may determine the pre-fault quantities for the power network based on the electrical measurements, as described above in FIG. 6.

At block 856, the computing system may determine the faulted quantities for the power network based on the electrical measurements, as described above in FIG. 6.

At block 858, the computing system may determine the incremental quantities for the power network according to the equations (1) and (2), as described above in FIG. 6. As illustrated in FIG. 6, a delay time is used in the calculation of the incremental quantities. The delay time may be a predetermined number of time cycles (e.g., "4 cycles" in FIG. 6) when no shunt fault is detected. When a shunt fault is detected, the delay time may be associated with the duration of the shunt fault (e.g., "shunt fault duration+5 cycles" in FIG. 6).

At block 860, the computing system may identify the fault by using the incremental quantities calculated in block 858 and the equations/relationships (3)-(17) described above.

After the fault is identified, the computing system may send commands to related devices (e.g., contactors, relays, circuit breakers) to adjust operations based on the identified fault at block 862. In addition, the fault information may be used by dispatch crews for maintenance operations. For example, the operations might include a protective action, which may include opening or closing a circuit breaker, selectively isolating a portion of the electric power system via the breaker, etc. In various examples, the protective action may involve coordinating protective actions with other devices in communication with the power network 100.

It should be noted that the fault location mentioned in the examples described above pertains to per unit fault location, but this output can be used to calculate the actual fault location in miles or kilometers if the total line length is mentioned. It should also be noted that, the method and figures described above may be used for phase incremental quantities and sequence incremental quantities.

It should be understood that logically equivalent circuitry may be used herein to implement the systems and methods described. For example, a logical XOR gate may be replaced via a logically equivalent combination of NOT gates, AND gates, Inverse NOT gates, OR gates, NAND gates, NOR gates, or the like.

While examples and applications of the disclosure have been illustrated and described, it is to be understood that the disclosure is not limited to the precise configurations and components disclosed herein. For example, the systems and methods described herein may be applied to an industrial electric power system or an electric power system implemented in a boat or oil platform that may or may not include long-distance transmission of high-voltage power. Accordingly, many changes may be made to the details of the above-described examples without departing from the underlying principles of this disclosure. The scope of the present disclosure should, therefore, be determined only by the following claims.

Indeed, the examples set forth in the present disclosure may be susceptible to various modifications and alternative forms, specific examples have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A system, comprising:
    a set of sensors configured to acquire electrical measurements associated with a power network; and
    a processing device configured to:
        determine one or more pre-fault quantities based on the electrical measurements;
        determine one or more faulted quantities corresponding to the one or more pre-fault quantities based on the electrical measurements;
        determine each of one or more incremental quantities based on a respective pre-fault quantity of the one or more pre-fault quantities and a respective faulted quantity of the one or more faulted quantities;
        calculate a ratio based on the one or more incremental quantities, wherein the ratio is associated with at least two types of sequence incremental quantities;
        identify a fault type based on the ratio; and
        send one or more commands to one or more devices to adjust one or more operations based on the fault type.

2. The system of claim 1, wherein the power network comprises a three-phase power network.

3. The system of claim 1, wherein the one or more incremental quantities comprises a sequence incremental quantity.

4. The system of claim 1, wherein the fault type comprises a broken conductor fault.

5. The system of claim 4, wherein the processing device is further configured to:
    determine that the fault type does not comprise the broken conductor fault when the ratio is not greater than a predetermined value.

6. The system of claim 1, wherein the set of sensors comprises intelligent electronic devices.

7. The system of claim 1, wherein the one or more devices comprises a circuit breaker, and wherein the one or more operations are associated with opening or closing the circuit breaker.

8. A method to identify a fault in a power network, comprising:
    determining, via one or more processors, one or more pre-fault quantities based on electrical measurements acquired by a set of sensors associated with the power network;
    determining, via the one or more processors, one or more faulted quantities corresponding to the one or more pre-fault quantities based on the electrical measurements;
    determining, via the one or more processors, each of one or more incremental quantities based on a respective pre-fault quantity of the one or more pre-fault quantities and a respective faulted quantity of the one or more faulted quantities;
    calculating a ratio based on the one or more incremental quantities, wherein the ratio is associated with at least two types of sequence incremental quantities;
    identifying a fault type based on the ratio; and
    sending one or more commands to one or more devices to adjust one or more operations based on the fault type.

9. The method of claim 8, wherein the power network comprises a three-phase power network.

10. The method of claim 8, wherein the one or more incremental quantities comprises a sequence incremental quantity.

11. The method of claim 8, wherein the fault type comprises a broken conductor fault.

12. The method of claim 11, comprising:
    determining that the fault type does not comprise the broken conductor fault in response to the ratio is not greater than a predetermined value.

13. The method of claim 11, comprising:
    comparing a magnitude of at least one of the one or more incremental quantities with a respective magnitude of a moving average of corresponding pre-fault quantity of the one or more pre-fault quantities.

14. The method of claim 13, comprising:
    determining that the fault type does not comprise the broken conductor fault in response to the magnitude of at least one of the one or more incremental quantities is not greater than a predetermined percentage of the respective magnitude of the moving average of corresponding pre-fault quantity of the one or more pre-fault quantities.

15. The method of claim 13:
    determining that the fault type does not comprise the broken conductor fault in response to the magnitude of at least one of the one or more incremental quantities is not less than a product of a predetermined value multiplied by the respective magnitude of the moving average of corresponding pre-fault quantity of the one or more pre-fault quantities.

16. The method of claim 15, comprising:
    determining that the fault type comprises a shunt fault in response to the magnitude of the at least one of the one or more incremental quantities is greater than the product of the predetermined value multiplied by the respective magnitude of the moving average of corresponding pre-fault quantity of the one or more pre-fault quantities.

17. The method of claim 14, wherein the at least one of the one or more incremental quantities comprises a sequence incremental quantity and the corresponding pre-fault quantity of the one or more pre-fault quantities comprises a sequence pre-fault quantity.

18. The method of claim 8, wherein the one or more faulted quantities comprises a sequence faulted quantity and the one or more pre-fault quantities comprises a corresponding sequence pre-fault quantity, and wherein a switching load occurs when a magnitude of the sequence faulted quantity is greater than a magnitude of a moving average of the corresponding sequence pre-fault quantity.

19. The method of claim 8, wherein the set of sensors comprises intelligent electronic devices.

20. A tangible, non-transitory, computer-readable medium comprising computer-executable instructions that, when executed, are configured to cause one or more processors to perform operations comprising:

determining one or more pre-fault quantities based on electrical measurements acquired from a set of sensors associated with a power network;

determining one or more faulted quantities corresponding to the one or more pre-fault quantities based on the electrical measurements;

determining each of one or more incremental quantities based on a respective pre-fault quantity of the one or more pre-fault quantities and a respective faulted quantity of the one or more faulted quantities;

calculating a ratio based on the one or more incremental quantities, wherein the ratio is associated with at least two types of sequence incremental quantities;

identifying a fault type based on the ratio; and sending one or more commands to one or more devices to adjust one or more operations based on the fault type.

\* \* \* \* \*